(12) United States Patent
Fukuda

(10) Patent No.: US 6,647,520 B1
(45) Date of Patent: Nov. 11, 2003

(54) SEMICONDUCTOR DEVICE

(75) Inventor: Ryo Fukuda, Yohohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 442 days.

(21) Appl. No.: 09/708,064

(22) Filed: Nov. 8, 2000

(30) Foreign Application Priority Data

Nov. 9, 1999 (JP) .......................................... 11-317887

(51) Int. Cl.[7] .............................................. G11C 29/00
(52) U.S. Cl. ...................................... 714/718; 714/742
(58) Field of Search ....................... 365/185.22, 230.03, 365/51; 714/30, 718, 742

(56) References Cited

U.S. PATENT DOCUMENTS

| | | | | |
|---|---|---|---|---|
| 5,105,388 A | * | 4/1992 | Itano et al. ............. | 365/185.22 |
| 5,241,510 A | * | 8/1993 | Kobayashi et al. ..... | 365/230.03 |
| 5,559,748 A | | 9/1996 | Numata et al. | |
| 6,477,072 B2 | * | 11/2002 | Shimizu et al. ............... | 365/51 |
| 6,496,947 B1 | * | 12/2002 | Schwarz ....................... | 714/30 |

OTHER PUBLICATIONS

Yabe et al., "A Configurable DRAM Macro Design for 2112 Derivative Organizations to be Synthesized Using a Memory Generator," IEEE Journal of Solid–State Circuits (Nov. 1998), 33:1752–57.

* cited by examiner

Primary Examiner—David Ton
(74) Attorney, Agent, or Firm—Finnegan, Henderson, Farabow, Garrett & Dunner, L.L.P.

(57) ABSTRACT

A semiconductor device has a least one logic circuit and at least one memory macro cell having a plurality of memory cell array blocks each composed of a plurality of memory cells. Addresses for designating the memory cell array blocks in test are selected among external addresses by a switching signal. The semiconductor device may have a plurality of memory macro cells having a plurality of memory cell array blocks each composed of a plurality of memory cells. The memory macro cells are switched in configuration as having the same length of rows or columns between the memory macro cells in test. The configuration is different from a configuration of row and column for a regular operation.

20 Claims, 11 Drawing Sheets

SEMICONDUCTOR DEVICE

CROSS REFERENCE TO RELATED APPLICATIONS

The subject application is related to subject matter disclosed in Japanese Patent Application No. H 11-317887 filed on Nov. 9, 1999 in Japan to which the subject application claims priority under Paris Convention and which is incorporated herein by reference.

BACKGROUND OF THE INVENTION

The present invention relates to a semiconductor device having memory circuits.

Memory-logic LSIs (system LSIs) have been popular recently. These LSIs are used to constitute a specific system by mounting memory circuits and logic circuits on one chip. Circuits that are usually mounted on separate chips are mounted on one chip for memory-logic LSIs, thus requiring higher performance, lower power consumption and miniaturization (reduction of components).

There are two types for memory-logic LSIs. One is a custom LSI having custom logic and memory circuits. The other type is a ASIC (Application Specific IC) that is a semi-custom LSI having memory circuits memory macro cells) designed as function blocks.

ASICs are very popular for their flexibility to a variety of users' demands because they can be rearranged in a short turn around time.

As memory macro cells for ASICs, re-configurable memory macro cells have been developed.

Re-configurable memory macro cells are, however, disadvantageous in high cost for testing each macro cell due to different test programs for a plurality of different types of products using memory macro cells configured differently.

Moreover, memory macro cells cannot be tested at the same time due to different address spaces for a plurality of memory macro cells mounted on a one-chip memory-logic LSI.

SUMMARY OF THE INVENTION

A purpose of the present invention is to provide a LSI having re-configurable memory circuits with a low cost for memory testing and also switching in performance specifications.

The present invention provides a semiconductor device including: at least one logic circuit; and at least one memory macro cell having a plurality of memory cell array blocks each composed of a plurality of memory cells, wherein addresses for designating the memory cell array blocks in test are selected among external addresses by a switching signal.

Moreover, the present invention provides a semiconductor device including: at least one logic circuit; and a plurality of memory macro cells having a plurality of memory cell array blocks each composed of a plurality of memory cells, wherein at least one of the memory macro cells is switched in configuration as having the same length of rows or columns between the memory cell array blocks in test, the configuration being different from a configuration of row and column for a regular operation.

Furthermore, the present invention provides a semiconductor device having a plurality of memory macro cells, each memory macro cell including: a plurality of memory cell array blocks each having a plurality of memory cells, composed of rows and columns; a decoder configured to decode a row or a column address signal to select at least one memory cell located on a row or a column corresponding to the decoded address signal; and a switching circuit configured to convert the row or the column address signal in response to a switching signal and supply the converted signal to the decoder to set address spaces having the same number of rows or columns between the plurality of memory cells.

Moreover, the present invention provides a method of testing a semiconductor device having at least one logic circuit and at least one memory macro cell having a plurality of memory cell array blocks each composed of a plurality of memory cells, including the step of selecting addresses for designating the memory cell array blocks among external addresses by a switching signal.

Furthermore, the present invention provides a method of testing a semiconductor device having at least one logic circuit and a plurality of memory macro cells having a plurality of memory cell array blocks each composed of a plurality of memory cells, including the step of switching at least one of the memory macro cells in configuration as having the same length of rows or columns between the memory macro cells, the configuration being different from a configuration of row and column for a regular operation.

DETAILED DESCRIPTION OF PREFERRED EMBODIMENT

Preferred embodiments according to the present invention will be disclosed with reference to the attached drawings.

Embodiment 1

Figure 1A:
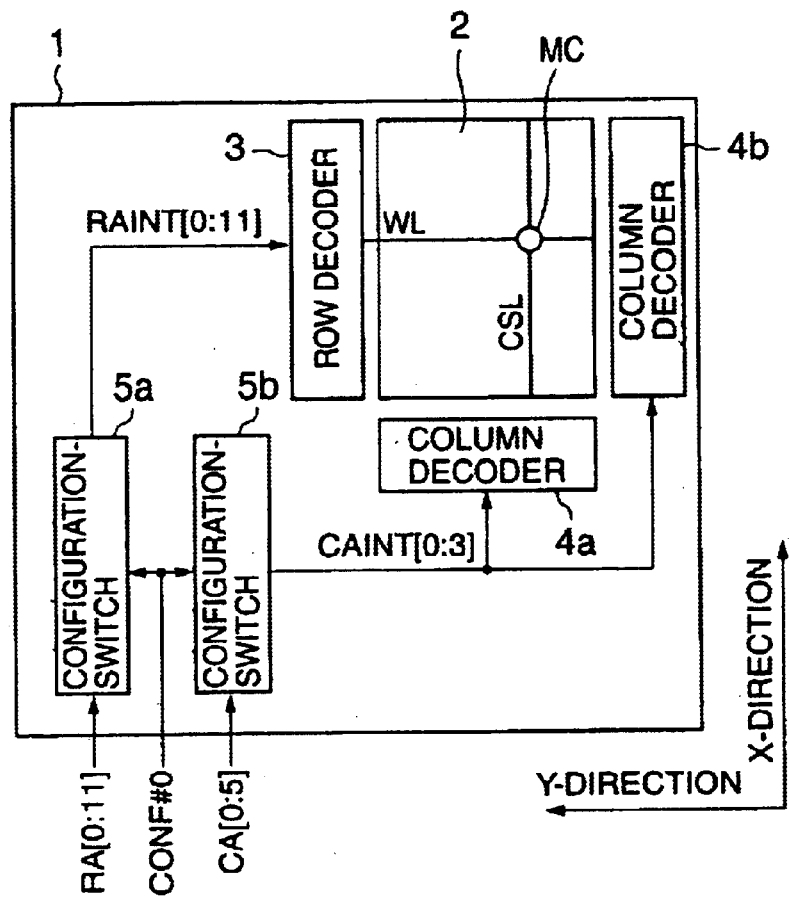
FIG. 1A shows one configuration of a memory macro cell used for a memory-logic LSI on which memory and logic circuits are mounted as a preferred embodiment according to the present invention.
Figure 1B:
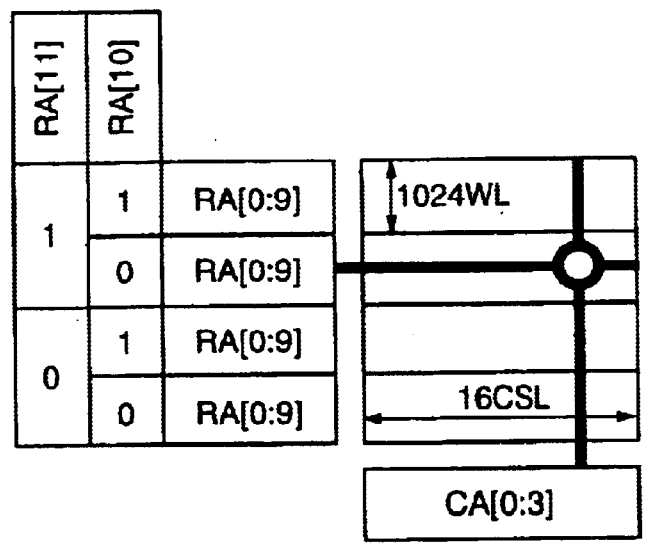
FIG. 1B is illustrates address allocation to the memory macro cell configured as shown in FIG. 1A.
Figure 2A:
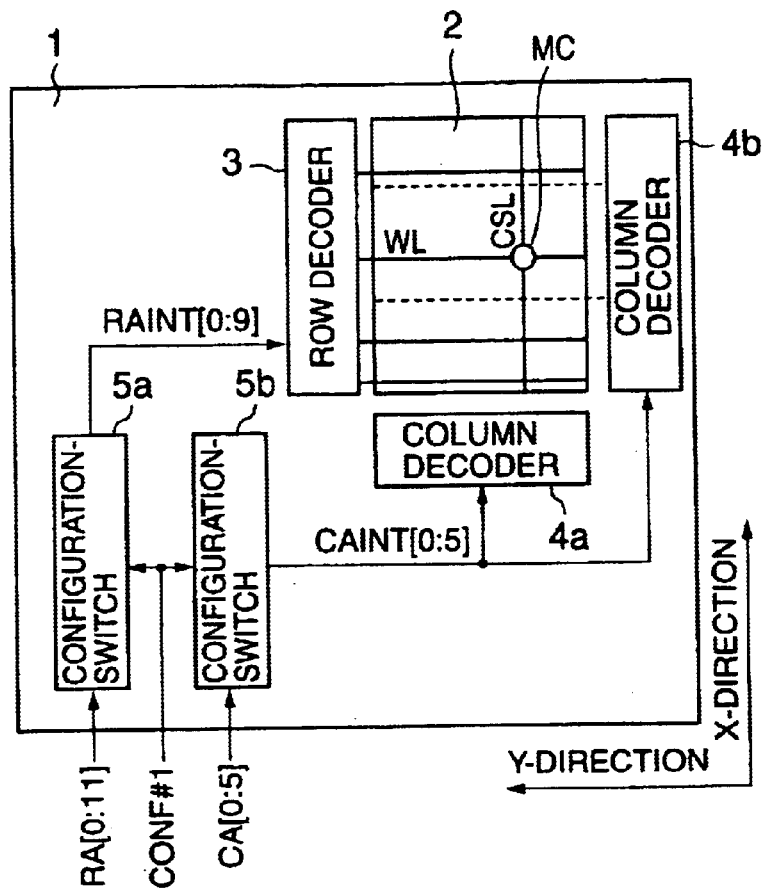
FIG. 2A shows another configuration of the memory macro cell shown in FIG. 1.
Figure 2B:
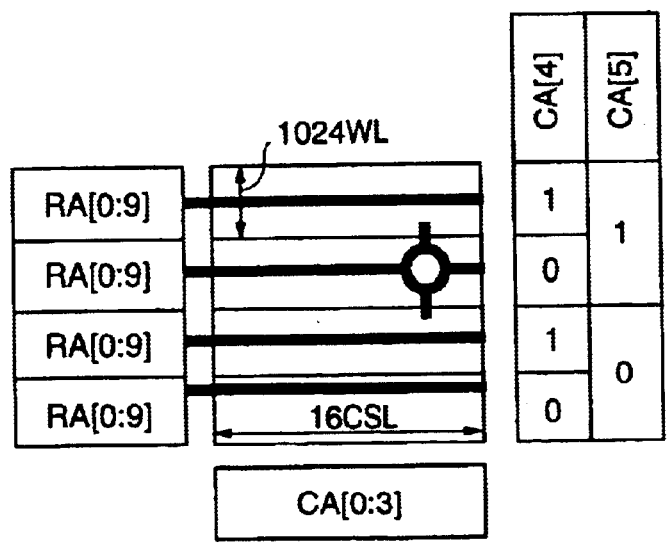
FIG. 2B illustrates address allocation to the memory macro cell configured as shown in FIG. 2A.

FIG. 1A shows one configuration of a memory macro cell 1 used for a memory-logic LSI on which memory and logic circuits are mounted. FIG. 2A shows another configuration of the memory macro cell 1. FIGS. 1B and 2B illustrate address allocation to the memory macro cell 1 configured as shown in FIGS. 1A and 2A, respectively.

An input configuration indication signal CONF is at a level "0" in FIG. 1A whereas it is "1" in FIG. 2A.

The memory macro cell 1 has a 64 k-bit storage capacity in this embodiment. The 64 k bits are configured as 4 k bits in row and 16 bits in column in FIG. 1A whereas 1 k bits in row and 64 bits in column in FIG. 2A. These configurations are switched by the signal CONF according to its level "0" or "1".

The memory macro cell 1 in this embodiment is a DRAM having a memory cell array 2 in which each memory cell MC is provided at the intersection of a word line WL and a column selection line CSL, a row decoder 3 for word line selection, and a column decoders 4a and 4b for selection of the column selection line.

Data can be written to and read from memory cells MC according to externally input row addresses RA [0:11] and column addresses [0:5].

The row addresses RA [0:11] and column addresses CA [0:5] are input to configuration-switching circuits 5a and 5b, respectively. These circuits decide whether or not to use all of the row addresses RA [0:11] and column addresses CA [0:5].

In FIG. 1A, a "0"-CONF signal is supplied to the configuration-switching circuit 5a to validate all the row addresses RA [0:11]. The row addresses RA [0:11] are converted into internal row addresses RAINT [0:11] and supplied to the row decoder 3. The row decoder 3 activates word lines WL corresponding to the internal row addresses RAINT [0:11]. In other words, a word line/4 k bits is activated for each of the 12-bit internal row addresses RAINT [0:11].

The "0"-CONF signal is also supplied to the configuration-switching circuit 5b to invalidate the upper 2 bits of the column addresses CA [0:5]. The column addresses CA [0:5] are thus converted into internal column addresses CAINT [0:3] and supplied to the column decoder 4a. The column decoder 4a activates column selection lines CSL corresponding to the internal column addresses CAINT [0:3].

The other column decoder 4b is used for internal addresses CA [4:5] that are required when some of the rows in the direction X are not allocated row addresses. In FIGS. 1A and 1B, however, the column decoder 4b is not used due to invalidation of the internal addresses CA [4:5] in this embodiment.

In FIG. 2A, a "1"-CONF signal is supplied to the configuration-switching circuit 5a to invalidate the upper two bits of the row addresses RA [0:11]. The row addresses RA [0:11] are thus converted into internal row addresses RAINT [0:9] and supplied to the row decoder 3. The row decoder 3 activates word lines WL corresponding to the internal row addresses RAINT [0:9]. In other words, a word line/1 k bits is activated for each of the 10-bit internal row addresses RAINT [0:9].

The "1"-CONF signal is also supplied to the configuration-switching circuit 5b to validate all the column addresses CA [0:5]. The column addresses CA [0:5] are converted into internal column addresses CAINT [0:5]. The lower 4 bits of the internal column addresses CAINT [0:5] are supplied to the column decoder 4a whereas the upper 2 bits are supplied to the column decoder 4b. The column decoder 4a activates column selection lines CSL corresponding to internal column addresses CAINT [0:3]. The column decoder 4b activates column selection lines CSL corresponding to internal column addresses CAINT [4:5].

As disclosed, in response to the "0"-CONF signal, the memory macro cell 1 is addressed with the row addresses RA [0:11] and the column addresses CA [0:3] to configure a 4 k-row×16-column memory cell, as shown in FIGS. 1A and 1B.

On the other hand, in response to the "1"-CONF signal, the memory macro cell 1 is addressed with the row addresses RA [0:9] and the column addresses CA [0:5] to configure a 1 k-row×64-column memory cell, as shown in FIGS. 2A and 2B.

As disclosed above, the memory macro cell according to the present invention is equipped with configuration-switching circuits for changing the configuration of the memory cell array in response to a configuration indication signal CONF.

Therefore, the present invention achieves the same test for a plurality of memory macro cells by changing the configuration of their memory cell arrays into the same configuration even though the cells will be used for different LSI types.

Changing the configuration of the memory cell arrays of the memory macro cells according to the present invention into a 1 k-row configuration is one of the preferable ways for conducting the same test to the memory macro cells installed in different types of LSI. For example. the memory macro cell shown in FIG. 1A and 1B installed in a one type of LSI can be changed to that shown in FIG. 2A and 2B to a test conducted for a plurality of memory macro cells.

Figure 3:
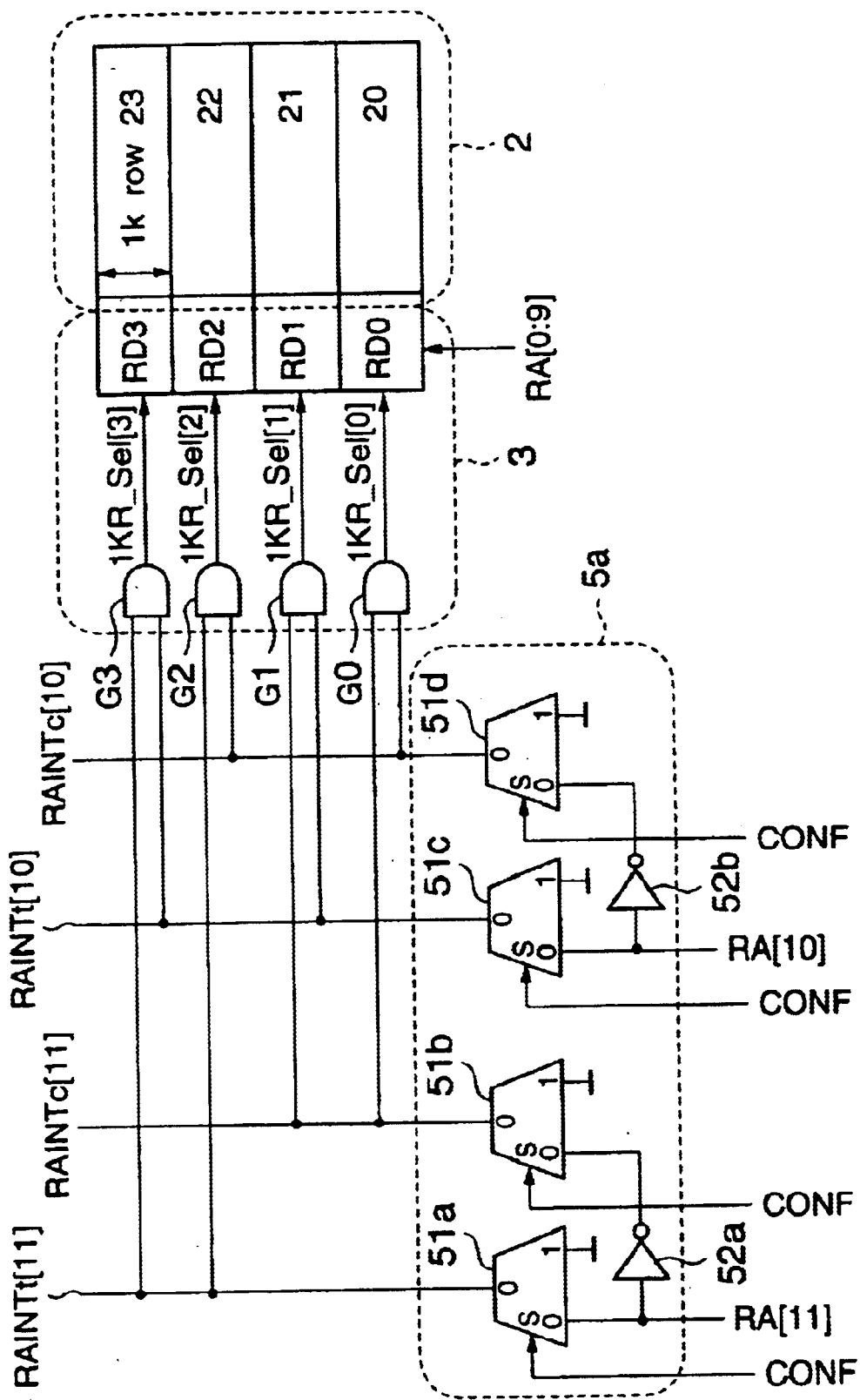
FIG. 3 shows a block diagram of a row-side configuration-switching circuit and a row decoder shown in FIGS. 1A and 2A.

FIG. 3 shows a block diagram of the configuration-switching circuit 5a and the row decoder 3 shown in FIGS. 1A and 2A.

The configuration-switching circuit 5a shown in FIG. 3 is a row address-switching circuit equipped with four multi-plexers 51a to 51d and two inverters 52a and 52b.

The configuration-switching circuit 5a makes valid or invalid the upper two-bit row addresses [10:11] to obtain complementary internal row addresses RAINTt [10:11] and RAINTc [10:11].

The multiplexers 51a to 51d have a switch terminal "S", a first input terminal "0" and a second input terminal "1" and an output terminal "O". Either of the first or the second terminal is connected to the output terminal in response to a configuration indication signal CONF supplied to the switch terminal.

In detail, row addresses RA [11] and RA [10] are supplied to the first input terminals "0" of the multiplexers 51a and 51c, respectively.

The row address RA [11] is further inverted by the inverter 52a and supplied to the first input terminal "0" of the multiplexer 51b. The row address RA [10] is further inverted by the inverter 52b and supplied to the first input terminal "0" of the multiplexer 51d.

A supply voltage Vcc is fed to the second input terminals "1" of the multiplexers 51a to 51d.

The row decoder 3 is equipped with AND gates G0 to G3 for 1 k-row selection and decoders RD0 to RD3 for cell selection in a 1 k row.

All the combinations of the internal row addresses RAINTt [10:11] and RAINTc [10:11] are supplied to the AND gates G0 to G3 to generate a 1 k-row selection signal 1KR_SEL[0], 1KR_SEL[1], 1KR_SEL[2] or 1KR_SEL[3].

The lower row addresses RA[0:9] are directly supplied to the decoders RD0 to RD3 without passing through the configuration-switching circuit 5a. One of the 1 k-row selection signals 1KR_SEL [0] to 1KR_SEL [3] supplied to the corresponding decoder RD0, RD1, RD2 or RD3 activates a word line in the corresponding 1 k-row block 20, 21, 22 or 23 in response to one of the row addresses RA [0:9].

A "0"-CONF signal supplied to the input terminal "S" of the multiplexer 51a lowers the level of the terminal "S" to low to bring the row address RA [11] into the internal row address RAINTt [11].

On the other hand, the "0"-CONF signal supplied to the input terminal "S" of the multiplexer 51b via the inverter 52a raises the level of the terminal "S" to high to bring the row address RA [11] into the inverted internal row address RAINTc [11].

Likewise, the "0"-CONF signal is supplied to the multiplexers 51c and 51d obtain complementary internal row addresses RAINTt [10] and RAINTc [10] corresponding to the row address RA [10].

For example, row addresses [10] and [11] at high and low levels, respectively, provides a high-level internal row address RAINTt [10], a low-level internal row address RAINTc [10], a low-level internal row address RAINTt [11] and a high-level internal row address RAINTc [11].

The combination of these addresses brings the output of the AND gate G1 into high whereas low for the outputs of the AND gates G0, G2 and G3. This produces a high-level 1KR SEL [1] selection signal only to activate a word line in the block 21 among the 1 k-row blocks 20 to 23.

As disclosed above, the "0"-CONF signal activates 1 k-row block corresponding to one of the external row addresses RA [10:11] to change the memory macro cell 1 into a 4 k-row memory cell, as shown in FIGS. 1A and 1B.

On the other hand, a "1"-CONF signal forces all the multiplexers 51a to 51d to output the supply voltage Vcc to invalidate the row addresses RA [10:11]. This brings all the internal row addresses RAINTt [10:11] and RAINTc [10:11] into high for the AND gates G0 to G3, thus generating high-level signals 1KR_SEL [0] to [3]. The high-level signals activate the word lines of the all the 1 k-row blocks 20 to 23 to change the memory macro cell 1 into a 1 k-row memory cell, as shown in FIGS. 2A and 2B.

Figure 4:
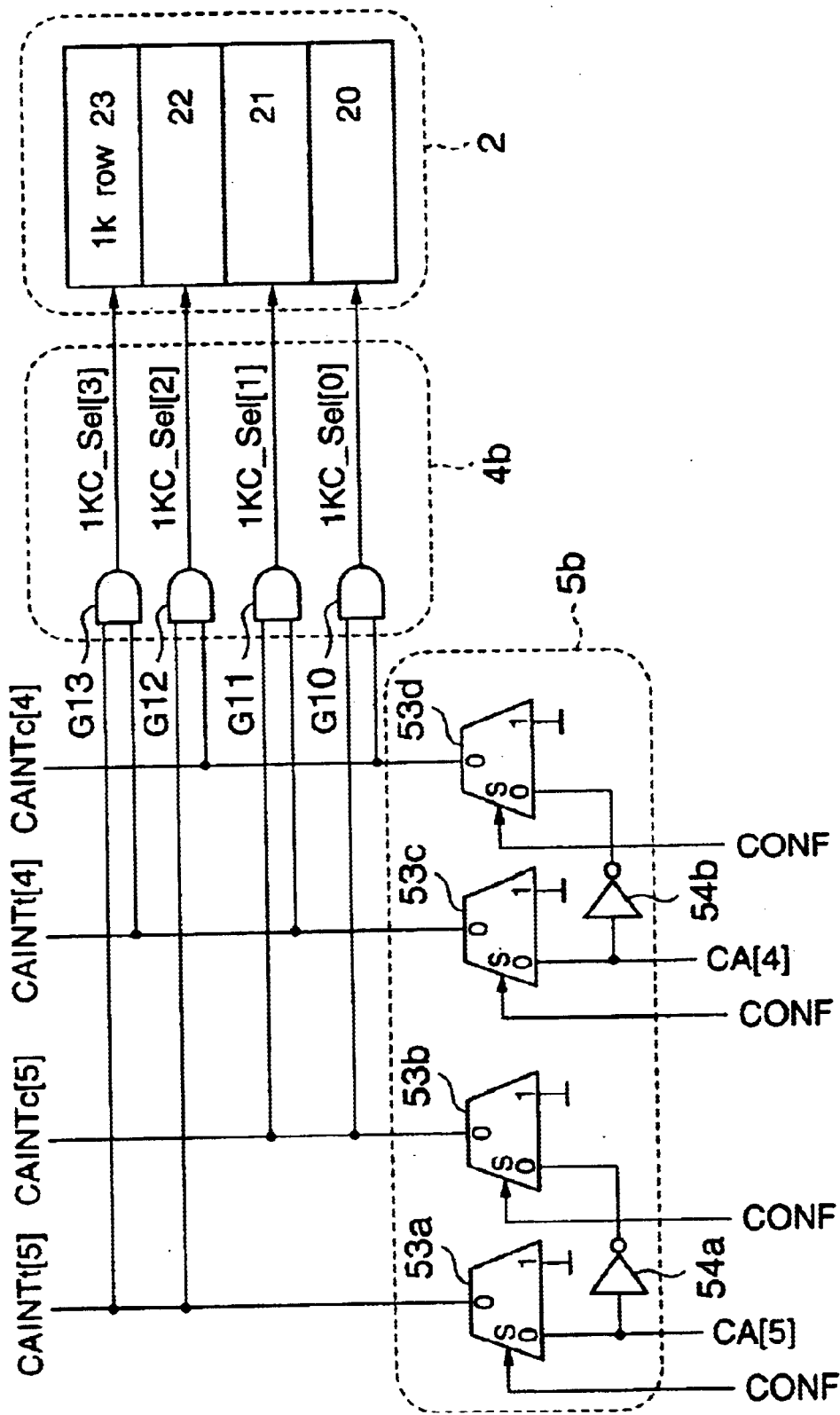
FIG. 4 shows a block diagram of a column-side configuration-switching circuit 5b and a column decoder shown in FIGS. 1A and 2A.

FIG. 4 shows a block diagram of the configuration-switching circuit 5b and the column decoder 4b shown in FIGS. 1A and 2A.

The configuration-switching circuit 5b shown in FIG. 4 is a column address-switching circuit equipped with four multiplexers 53a to 53d and two inverters 54a and 54b.

The configuration-switching circuit 5b makes valid or invalid the upper two-bit column addresses CA [4:5] to obtain complementary internal column addresses CAINTt [4:5] and CAINTc [4:5].

The multiplexers 53a to 53d have a switch terminal "S" a first input terminal "0" and a second input terminal "1" and an output terminal "O". Either of the first or the second terminal is connected to the output terminal in response to a configuration Indication signal CONF supplied to the switch terminal.

In detail, column addresses CA [5] and CA [4] are supplied to the first input terminals "0" of the multiplexers 53a and 53c, respectively.

The column address RA [5] is further inverted by the inverter 54a and supplied to the first input terminal "0" of the multiplexer 53b. The column address CA [4] is further inverted by the inverter 54b and supplied to the first input terminal now of the multiplexer 53d.

A supply voltage Vcc is fed to the second input terminals "1" of the multiplexers 53a to 53d.

The column decoder 4b is equipped with AND gates G10 to G13 for 1 k-row selection.

All the combinations of the internal column addresses CAINTt [4:5] and CAINTc [4:5] are supplied to the AND gates G30 to G13 to generate a 1 k-row selection signal 1KC_SEL[0], 1KC_SEL[1], 1KC_SEL[2] or 1KC_SEL[3].

The lower column addresses CA[0:3] are directly supplied to the other column decoder 4a without passing through the configuration-switching circuit 5b. One of the 1 k-row selection signals 1KC_SEL [0] to 1KC_SEL [3] activates a word line in the corresponding 1 k-row block 20, 21, 22 or 23 in response to one of the column addresses CA [0:3].

A "1"-CONF signal supplied to the input terminal "S" of the multiplexer 53a raises the level of the terminal "S" to high to bring the column address CA [5] into the internal column address CAINTt [5].

On the other hand, the "1"-CONF signal supplied to the input terminal "S" of the multiplexer 53b via the inverter 54a lowers the level of the terminal "S" to low to bring the column address CA [5] into the inverted internal column address CAINTc [5].

Likewise, the "1"-CONF signal is supplied to the multiplexers 53c and 53d obtain complementary internal column addresses CAINTt [4] and CAINTc [4] corresponding to the column address RA [4].

For example, column addresses CA[4] and [5] at high and low levels, respectively, provides a high-level internal column address CAINTt [4], a low-level internal column address CAINTc [4], a low-level internal column address CAINTt [5] and a high-level internal column address CAINTc [5].

The combination of these addresses brings the output of the AND gate G11 into high whereas low for the outputs of the AND gates G10, G12 and G13. This produces a high-level 1KC_SEL [1] selection signal only to activate a column line CSL in the block 21 among the 1 k-row blocks 20 to 23.

As disclosed above, the "1"-CONF signal activates 1 k-row block corresponding to one of the external column addresses RA [4:5] to change the memory macro cell 1 into a 64-column memory cell, as shown in FIGS. 2A and 2B.

On the other hand, a "0"-CONF signal forces all the multiplexers 53a to 53d to output the supply voltage Vcc to invalidate the column addresses CA[4:5]. This brings all the internal column addresses CAINTt [4:5] and CAINTc [4:5] into high for the AND gates G10 to G13, thus generating high-level signals 1KC_SEL [0] to [3]. The high-level signals activate the word lines of the all the 1 k-row blocks 20 to 23 to change the memory macro cell 1 into a 16-column memory cell, as shown in FIGS. 1A and 1B.

Figure 5:
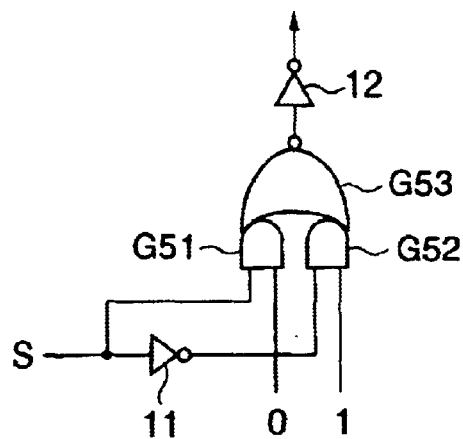
FIG. 5 shows a circuit diagram of multiplexers shown in FIG. 4.

A circuit diagram shown in FIG. 5 is an example of the multiplexers 53a to 53d shown in FIG. 4.

A multiplexer shown in FIG. 5 is equipped with an inverter I1, AND gates G51 and G52 a NOR gate G53 and an Inverter I2. The first input terminal "0" and the input terminal "S", and the second input terminal "1", such as, those shown in FIG. 4, are connected to the AND gates G51 and G52, respectively. Data input to the terminal "S" is directly supplied to the AND gate G51 and further inverted by the inverter I1 and supplied to the AND gate G52. The output of the two AND gates are supplied to the NOR gate G53 and inverted by the inverter I2.

A high-level signal supplied to the input terminal "S" allows an input signal to the first input terminal "0" to be output from the inverter I2 (output terminal "O"). On the other hand, a low-level signal supplied to the input terminal "S" allows an input signal to the second input terminal "1" to be output from the inverter I2.

Although not shown, for the multiplexers 51a to 51d shown in FIG. 3. the first input terminal "0" and the second input terminal "1" connected to the AND gates G51 and G52, respectively, are inverted.

In this case, a low-level signal supplied to the input terminal "S" allows an input signal to the first input terminal "0" to be output from the inverter I2 (output terminal "O"). On the other hand, a high-level signal supplied to the input terminal "S" allows an input signal to the second input terminal "1" to be output from the inverter I2.

As disclosed above, the 64 k-memory macro cell according to the preferred embodiment is changeable between configurations having different row-column ratios in response to a configuration-switching signal CONF.

It is thus achieved that, for example, a 64 k-memory macro cell is tested as having a (4 k-row×16-column) configuration for installation on a particular system LSI and is changed into a (1 k-row×64-column) configuration for a test which is conducted for every 64 K-memory macro cell with no consideration of LSI types.

Therefore, a plurality of memory macro calls according to the present invention in a 1 k-row configuration allows a test having the same test program common to every memory macro cell.

The present invention is disclosed more in detail with a plurality of memory macro cells.

Figure 6A:
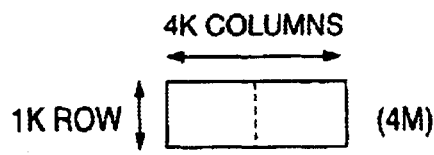
FIGS. 6A to 6C illustrate configurations of memory macro cells installed in different products.
Figure 6B:
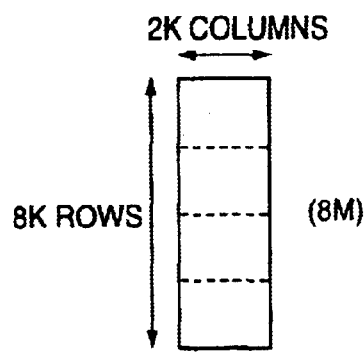
Figure 6C:
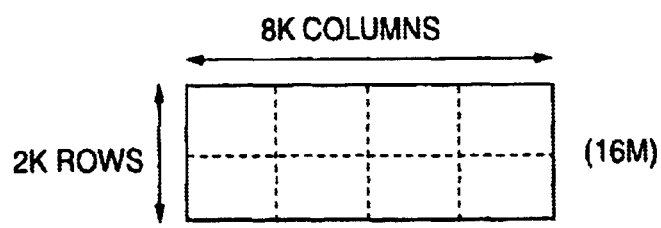

FIGS. 6A to 6C illustrate configurations of memory macro cells according to the present invention installed in different LSI types.

Illustrated in FIGS. 6A, 6B and 6C are a (1 K-row×4 K-column) 4M-memory macro cell, a (4 K-row×2 K-column) 8M-memory macro cell and a (2 K-row×8 K-column) 16M-memory macro cell, receptively, for respective LSI types.

Each memory cell is tested as it is with no configuration changing for a particular LSI type on which the memory cell will be installed.

Figure 7A:
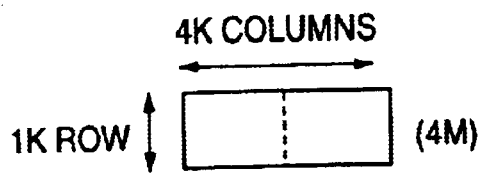
FIGS. 7A to 7C illustrate configurations changed from those shown in FIGS. 6A to 6C.
Figure 7B:
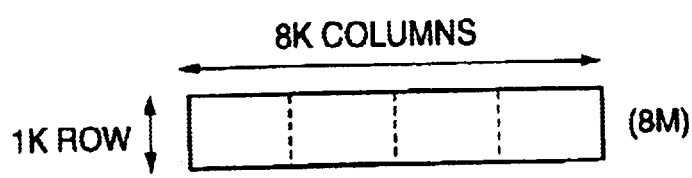
Figure 7C:
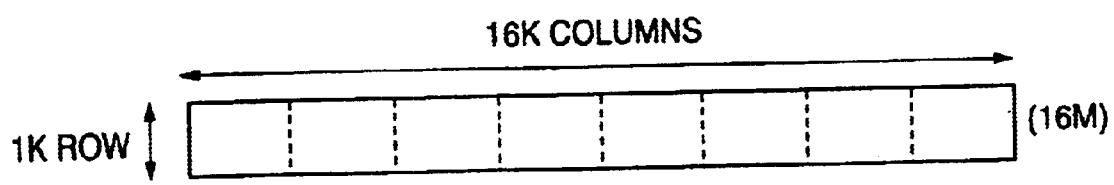

On the contrary, the memory calls are changed into configurations having 1 k-row addresses as illustrated in FIGS. 7A to 7C by means of a configuration-switching signal CONF for a test common to every memory macro cell.

In FIG. 7A, the 4M-memory macro cell has no change in configuration from that shown in FIG. 6A.

In FIG. 7B, the 8M-memory macro cell is changed into a (1 K-row×8 K-column) configuration from the (4 K-row×2 K-column) configuration shown in FIG. 6B.

In FIG. 7C, the 16M-memory macro cell is changed into a (1 K-row×16 K-column) configuration from the (2 K-row×8 K-column) configuration shown in FIG. 6C.

Figure 8A:
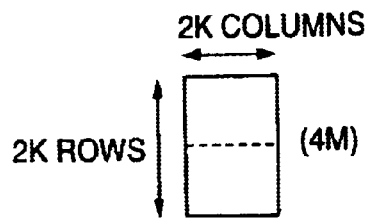
FIGS. 8A to 8C illustrate different configurations changed from those shown in FIGS. 6A to 6C.
Figure 8B:
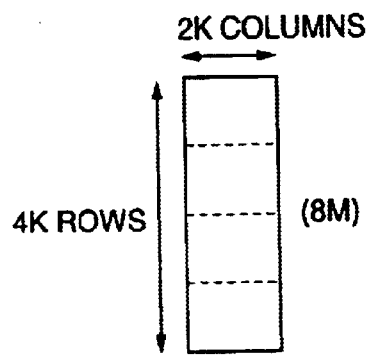
Figure 8C:
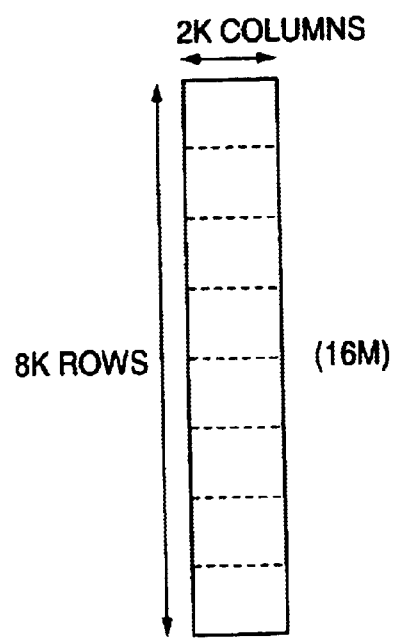

FIGS. 8A to 8C illustrate 2 K-column configurations changed from 4 K-, 2 K- and 8 K-column configurations shown in FIGS. 6A to 6C, respectively.

The same row capacity-configuration as illustrated in FIGS. 7A to 7C and 8A to 8C allows the same test program, failed bit map-template, and 80 on, thus reducing a cost for testing.

Embodiment 2

Figure 9:
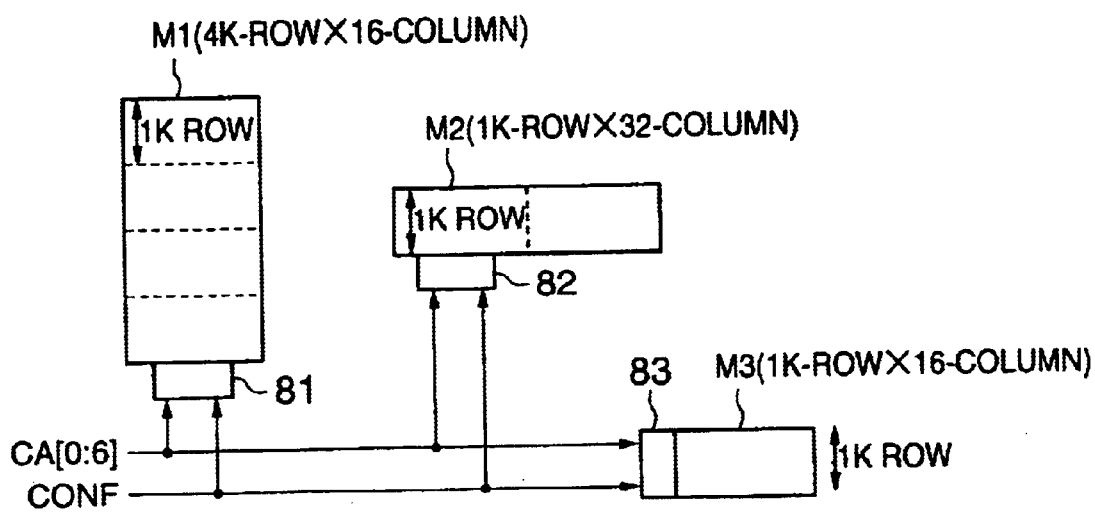
FIG. 9 illustrates three memory macro cells installed on one chip for a particular type of system LSI as another preferred embodiment according to the present invention.

FIG. 9 illustrates three memory macro cells installed on one chip for a particular type of system LSI.

Memory macro cells M1, M2 and M3 are a 64 K-bit (4 K-row×16-column)-, a 32 K-bit (1 K-row×32-column)- and a 16 K-bit (1-row×16-column)-memory macro cell, respectively. One column of the memory macro cell M2 corresponds to two I/Os. The Memory macro cells M1, M2 and M3 have configuration-changing circuits 81 to 83, respectively, corresponding to the column configuration-changing circuit 5b shown in FIG. 1.

Figure 10A:
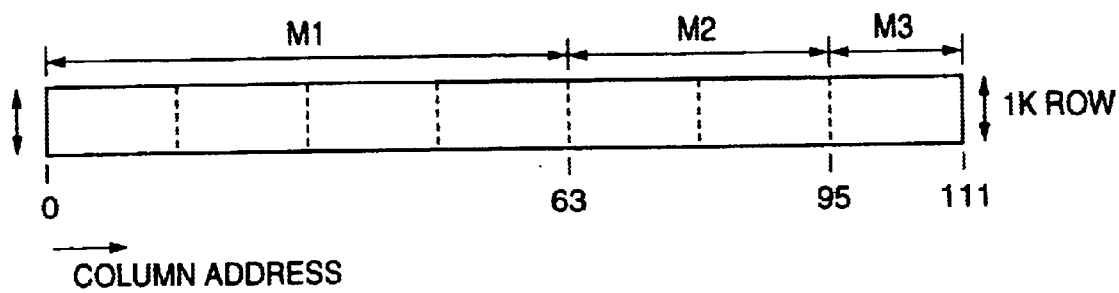
FIGS. 10A and 10B illustrate different configurations changed from those shown in FIGS. 9.
Figure 10B:
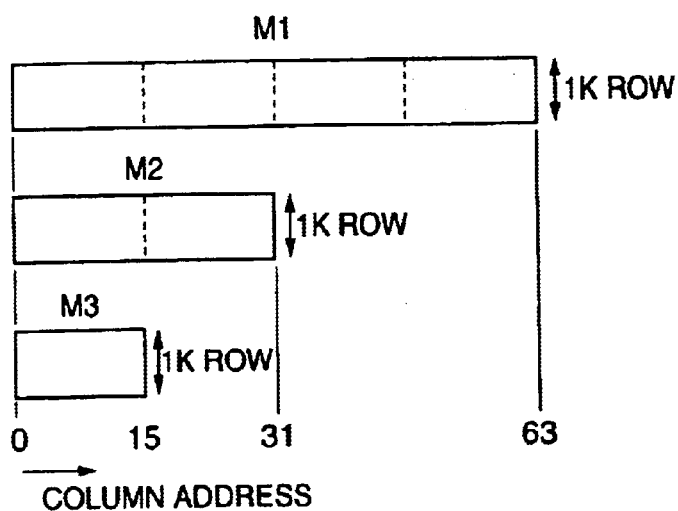

FIG. 10A illustrates address allocation to the memory macro cells M1 to M3 shown in FIG. 9. The memory macro cells are continuously accessible with increase in external addresses as if they constitute one memory macro cell. FIG. 10B illustrates the configurations of the memory macro cells M1, M2 and M3 for regular access. In FIG. 10B, the address allocation to the memory macro cell M1 only has been changed like the Embodiment 1.

The configuration illustrated in FIG. 10A is attained as follows;

The (4 K-row×16-column) configuration of the memory macro cell M1 is changed into a (1 K-row×64-column) configuration by means of a configuration indication signal CONF supplied to the column configuration-changing circuit 81 (FIG. 9) with column address allocation from 0 to 63.

For the memory macro cell M2, the column addresses CA are shifted by 64 and the column addresses 64 to 95 are allocated for two I/Os per column by the column configuration-changing circuit 82 (FIG. 9).

For the memory macro cell M3. the column address (CA) 64 is shifted by 32 to allocate the column addresses 96 to 111 by the column configuration-changing circuit 83 (FIG. 9).

Figure 11:
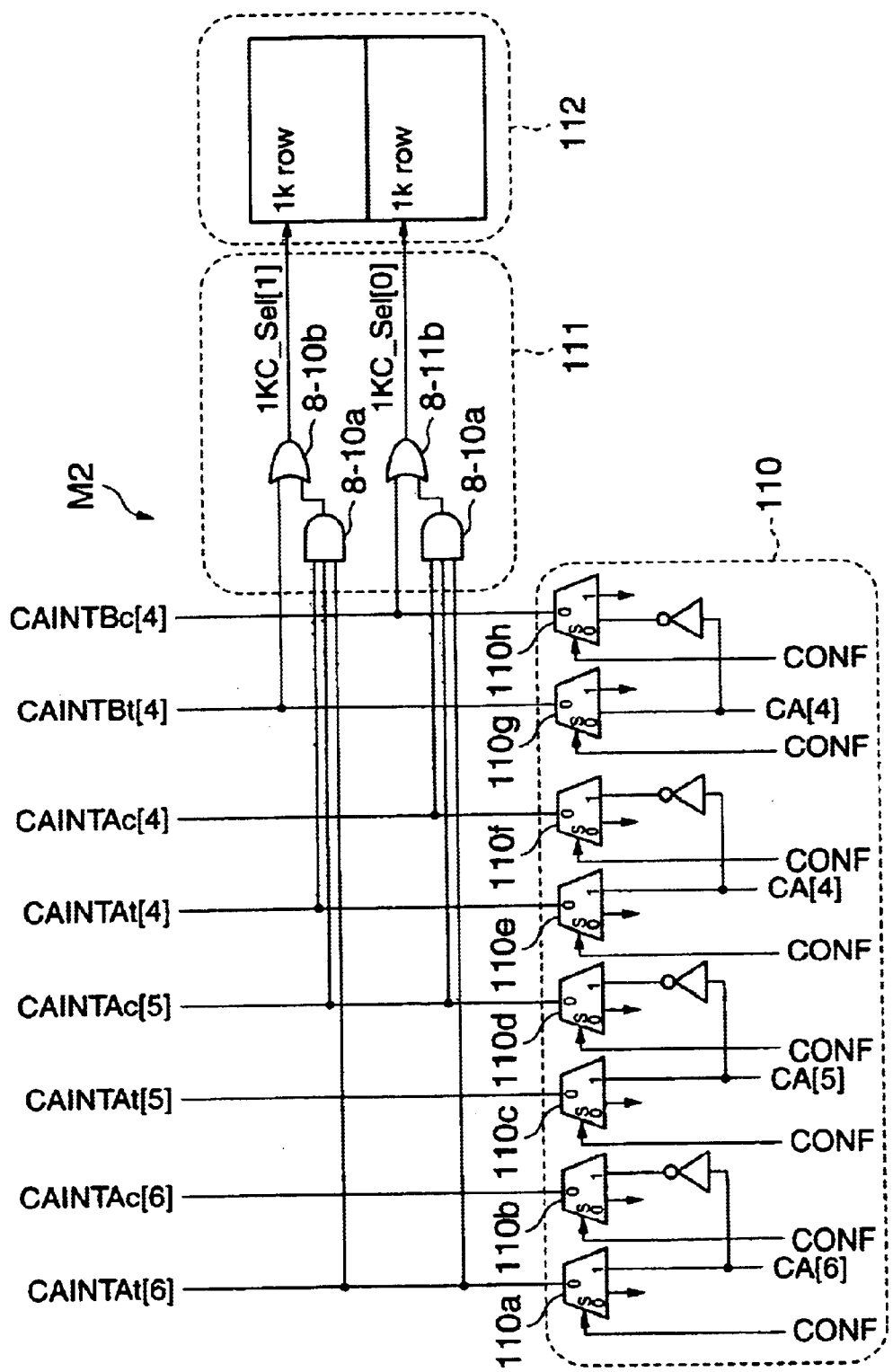
FIG. 11 shows circuit diagrams of a column-side configuration-switching circuit and a column decoder in the embodiment shown in FIG. 9.

FIG. 11 shows a circuit diagram used for column address shifting for, for example, the memory macro cell M2 from FIG. 9 to FIG. 10A.

Shown in FIG. 11 are a memory cell array 112 of two 1 K rows corresponding to the memory macro cell M2 (FIG. 9), and a column configuration-switching circuit 110 and a column decoder 111 for the memory cell array 112.

The column configuration-switching circuit 110 has multipliers 110a to 110h and their corresponding inverters, controlled by a configuration-switching signal CONF, like those shown in FIGS. 3 and 4.

For a test-configuration A shown in FIG. 10A, the column addresses CA [4:6] are converted into complementary internal column addresses CAINTAt [4:6] and CAINTAC [4:6] and supplied to the column decoder 111.

For a regular-configuration B shown in FIG. 10B, the column address CA [4] is converted into complementary internal column addresses CAINTAt [4] and CAINTAc [4] and supplied to the column decoder 111.

A decode output for the test-configuration A and that for the regular-configuration 8 are ORed by the column decoder 111. AND gates 8–10a and 8–11a constitute a decoder for the test-configuration A. The outputs of the AND gates 8–10a and 8–11a are fed to OR gates 8–10b and 8–11b, respectively. There is no specific decoder for the regular-configuration B because of one address. Internal column addresses are directly supplied to the OR gates 8–10b and 8–11b.

In detail, the internal column addresses CAINTAt [6], CAINTAc [5] and CAINTAt [4] are supplied to the AND gates 8–10a that produces a high-level output when all the input addresses are high.

The output of the AND gates 8–10a and an internal column address CAINTBt [4] are supplied to the OR gate 8–10b that produces a selection signal 1KC_Sel [1] for selecting one of the 1 K-row.

On the other hand, internal column addresses CAINTAt [6], CAINTAc [5] and CAINTAC [4] are supplied to the AND gates 8–11a that produces a high-level output when all the input addresses are high.

The output of the AND gates 8–11a and an internal column address CAINTBc [4] are supplied to the OR gate 8–11b that produces a selection signal 1KC_Sel [0] for selecting the other 1 K-row.

A "0"-configuration indication signal CONF forces the multilplexers 110g and 110h to connect the first input terminal "1" (Vss) to the output terminal "O". This brings the internal column addresses CAINTBt [4] and CAINTBc [4] into a low level (non-active state), thus no 1 K-row being selected in response to these addresses.

On the other hand, the "0"-configuration indication signal CONF allows the multiplexers 110a to 110f to produce high-level internal column addresses CAINTAt [4:6] and low-level internal column addresses CAINTAc [4:6] in response to the column addresses CA [4:6].

In detail, a high-level column address CA [6] and a low-level column address CA [5] activate either one of the selection signals 1KC_Sel [0:1] in accordance with the value of column address CA [4] to activate either one of the two 1 K-rows in the memory cell array 112, which means addresses 64 to 95 are allocated to the column address space of the memory macro cell M2, as shown in FIG. 10A.

On the contrary, a "1"-configuration indication signal CONF forces all the internal column addresses CAINTAt [4:6] and CAINTAc [4:6] to be low without respect to input column addresses.

The "1"-configuration indication signal CONF allows the internal column addresses CAINTBt [4] and CAINTBc [4] to be active in accordance with the input column address CA [4]. This activates either one of the selection signals 1KC_Sel [0:1] to activate either one of the two 1 K-rows in the memory cell array 112, which means addresses 0 to 31 are allocated to the column address of the memory macro cell M2, as shown in FIG. 10B.

According to this embodiment, column address allocation as disclosed above offers a test with increase in address for successive access to the memory macro cells M1 to M3 as if they constitute one (1 k-row×112-column) memory macro cell. A period of such a test is very short compared to tests in which the memory macro cell M1 to M3 are accessed separately.

FIG. 9 illustrates different types (capacity) of the memory macro cells M1 to M3. The present invention is, however, is applicable to the same type (capacity) of the memory macro cells.

Moreover, FIG. 10A illustrates successive address allocation, such as, from 0 to 63, 64 to 95 and 96 to 111. Not only that, the present invention achieves un-successive address allocation, such as, from 0 to 63, 64 to 84 and 96 to 111.

Figure 12:
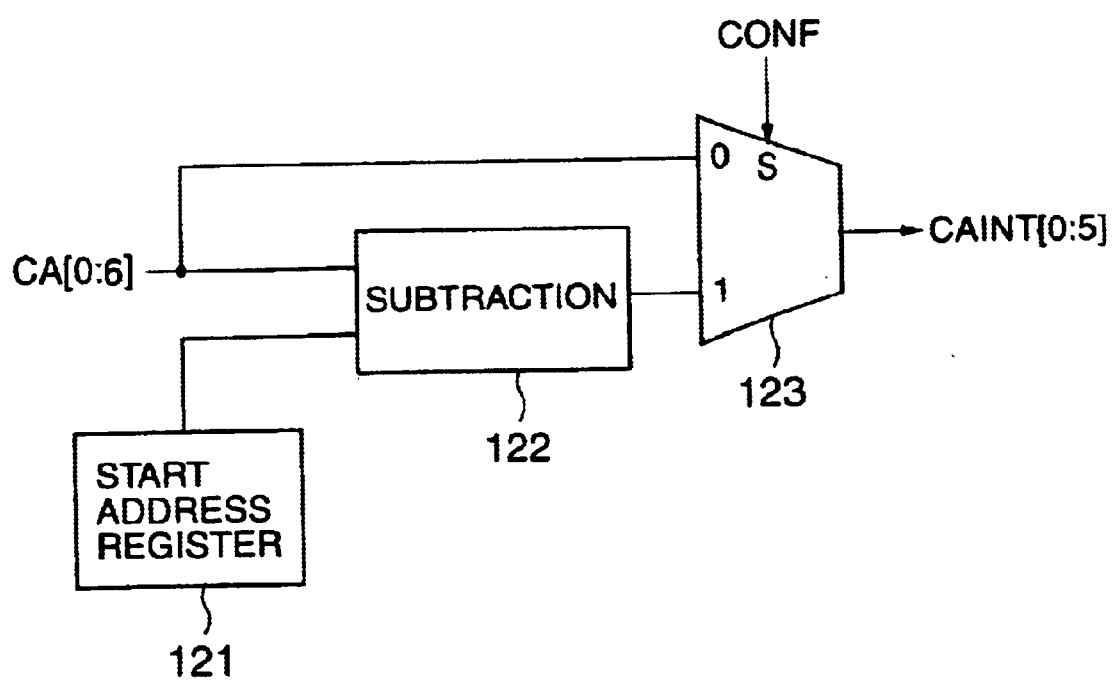
FIG. 12 shows a modification to the configuration-switching circuit shown in FIG. 11.

FIG. 12 shows a modification to the configuration-switching circuit for column-address shifting, such as, illustrated in FIG. 10A, for the macro memory cell M2 shown in FIG. 9.

In FIG. 12, a start address stored in a start address register 121 is supplied to a subtracter 122 and subtracted from input column addresses CA[0:6]. The output of the subtracter 122 and the column addresses CA [0:6] are supplied to a multiplier 123, either one of them being output as internal addresses [0:6] according to a configuration-switching signal CONF "0" or "1".

A "1"-configuration-switching signal CONF allows the input column addresses CA[0:6] as internal addresses [0:6] to allocate addresses 0 to 31 in a regular address space for the memory macro cell M2 as illustrated in FIG. 10B.

On the other hand, a "0"-configuration-switching signal CONF allocates the values, such as, 64 to 95, as illustrated in FIG. 10A, shifted from the start address stored in the start address register 121 in a column address space for the memory macro cell M2.

As disclosed, this modification also achieves selection between the test-configuration A and the regular-configuration B.

Disclosed so far is change in configuration of memory macro cell for reduction in cost of test. Not only limited to this, however, the present invention also achieves change in configuration of memory macro cells mounted on a memory-logic LSI for specific access speed and power consumption, for ample, change between the (1 k-row×4 k-column)-configuration shown in FIG. 6A and the (2 k-row×2 k-column)-configuration shown in FIG. 8A according to a configuration-switching signal CONF.

In detail, for example, the memory macro cell is changed to the (1 k-row×4 k-column)-configuration according to a "0"-configuration-switching signal CONF. It is then changed to the (2 k-row×2 k-column)-configuration according to a "1"-configuration-switching signal CONF.

The former configuration has a high access speed because of many columns, however, consumes much power. Contrary to this, the latter configuration has a low access speed, however, consumes little power.

As disclosed, the present invention offers a variety of usage of memory-logic LSIs by changing or selecting configuration of memory macro cells as one of performance specifications.

As disclosed above, the present invention offers memory macro cells that are changeable in configuration. Reduction in cost of test is thus achieved by changing memory macro cells to be used for different purposes or different types of products into the same configuration.

Moreover, according to the present invention, a plurality of memory macro cells mounted on a one-chip LSI are changed into different configurations, thus achieving the same test to the calls by allocating a series of address space to them.

What is claimed is:

1. A semiconductor device comprising:
   at least one logic circuit; and
   at least one memory macro cell having a plurality of memory cell array blocks each composed of a plurality of memory cells,
   wherein addresses for designating the memory cell array blocks in test are selected among external addresses by a switching signal.

2. A semiconductor device comprising:
   at least one logic circuit; and
   a plurality of memory macro cells having a plurality of memory cell array blocks each composed of a plurality of memory cells in a specific length of rows or columns; and a switching circuit to switch at least one of the memory macro cells in configuration as having the same length of rows or columns between the memory cell array blocks in response to an external test address signal, the configuration being different from a configuration of row and column for a regular operation.

3. The semiconductor device according to claim 2, wherein at least one of the memory macro cells is switched in configuration as having the same length of rows corresponding to one memory cell array block in the test.

4. The semiconductor device according to claim 2, wherein addresses are allocated to rows or columns not being subjected to the configuration switching to the same length so that the same address is not allocated between the memory macro cells.

5. The semiconductor device according to claim 4, wherein successive addresses are allocated to the rows or the columns not being subjected to the configuration switching to the same length, for at least two memory macro cells.

6. A semiconductor device having a plurality of memory macro cells, each memory macro cell comprising:
a plurality of memory cell array blocks each having a plurality of memory cells, composed of rows and columns;
a decoder configured to decode a row or a column address signal to select at least one memory cell located on a row or a column corresponding to the decoded address signal; and
a switching circuit configured to convert the row or the column address signal in response to a switching signal and supply the converted signal to the decoder to set address spaces having the same length of rows or columns between the plurality of memory cells.

7. The semiconductor device according to claim 6, wherein the switching circuit activates all of the memory cell blocks or a part of the blocks.

8. The semiconductor device according to claim 7, wherein the switching circuit includes:
a plurality of first logic circuits each configured to receive the row or the column address signal and a predetermined voltage and output either the address signal or the voltage in response to the switching signal; and
the decoder includes:
a plurality of second logic circuits configured to output logical multiplication of address signals or voltages output by the first logic circuits.

9. The semiconductor device according to claim 7, wherein the decoder includes a plurality of constituents each configured to select at least one memory cell in the part of the memory cell array blocks.

10. The semiconductor device according to claim 9, wherein the decoder is a row decoder.

11. The semiconductor device according to claim 6, wherein the switching circuit includes:
a first selector configured to receive a column address signal indicating a first column address for use of the memory macro cells independently in response to the switching signal to select one of the rows; and
a second selector configured to receive a column address signal indicating a second column address for use of two or more of the memory macro cells in response to the switching signal, the second column address being not shared by at least the two memory macro cells, to select one of the rows, and
the decoder includes;
a logic circuit configured to take a logical sum of the outputs of the first and second selectors.

12. The semiconductor device according to claim 11, wherein the first selector includes a plurality of logic circuits, each configured to receive the column address signal and a predetermined voltage and output either the address signal or the voltage in response to the switching signal.

13. The semiconductor device according to claim 11, wherein column address signals for two or more of the memory macro cells indicate successive column addresses for at least two memory macro cells.

14. The semiconductor device according to claim 12, wherein the second selector includes a plurality of logic circuits, each configured to receive the column address signal and a predetermined voltage and output either the address signal or the voltage in response to the switching signal.

15. The semiconductor device according to claim 12, wherein the second selector includes:
an address register configured to store a start address;
a subtracter configured to subtract the start address from a column address indicated by the column address signal; and
a selector configured to select either the column addresses or the output of the subtracter as the second column address in response to the switching signal.

16. A method of testing a semiconductor device having at least one logic circuit and at least one memory macro cell having a plurality of memory cell array blocks each composed of a plurality of memory cells, comprising the step of selecting addresses for designating the memory cell array blocks among external addresses by a switching signal.

17. A method of testing a semiconductor device having at least one logic circuit and a plurality of memory macro cells having a plurality of memory cell array blocks each composed of a plurality of memory cells, comprising the step of switching at least one of the memory macro cells in configuration as having the same length of rows or columns between the memory macro cells in response to an external test address signal, the configuration being different from a configuration of row and column for a regular operation.

18. The method according to claim 17, wherein at least one of the memory macro cells are switched in configuration as having the same length of rows corresponding to one memory cell array block length.

19. The method according to claim 17 further comprising the step of allocating addresses to rows or columns not being subjected to the configuration switching to the same length so that the same address is not allocated between the memory macro cells.

20. The method according to claim 19, wherein successive addresses are allocated to the rows or the columns not being subjected to the configuration switching to the same length for at least two successive memory macro cells.

* * * * *

UNITED STATES PATENT AND TRADEMARK OFFICE
CERTIFICATE OF CORRECTION

PATENT NO. : 6,647,520 B1 Page 1 of 1
DATED : November 11, 2003
INVENTOR(S) : Fukuda It is certified that error appears in the above-identified patent and that said Letters Patent is hereby corrected as shown below:

Title page, Item [54] and Column 1, line 1,
Title, change "SEMICONDUCTOR DEVICE" to -- SEMICONDUCTOR DEVICE IN TEST HAVING ADDRESSES FOR DESIGNATING THE MEMORY CELL ARRAY BLOCKS TO BE SELECTED AMONG EXTERNAL ADDRESSES BY A SWITCHING SIGNAL --.

Title page,
Item [57], ABSTRACT,
Line 1, change "has a least" to -- has at least --.

Column 12,
Line 4, change "includes;" to -- includes: --.

Signed and Sealed this

Sixteenth Day of March, 2004

JON W. DUDAS
*Acting Director of the United States Patent and Trademark Office*